(12) United States Patent
Sorensen et al.

(10) Patent No.: US 8,718,562 B2
(45) Date of Patent: May 6, 2014

(54) PROCESSING AUDIO SIGNALS

(75) Inventors: Karsten Vandborg Sorensen,
Stockholm (SE); Jon Bergenheim,
Uppsala (SE)

(73) Assignee: Skype, Dublin (IE)

( * ) Notice: Subject to any disclaimer, the term of this patent is extended or adjusted under 35 U.S.C. 154(b) by 455 days.

(21) Appl. No.: 13/112,529

(22) Filed: May 20, 2011

(65) Prior Publication Data

US 2012/0295562 A1 Nov. 22, 2012

(51) Int. Cl.
*H04B 1/00* (2006.01)

(52) U.S. Cl.
USPC ........................................................ 455/63.1

(58) Field of Classification Search
USPC .......... 455/41.2, 63.1; 379/3, 406.08, 406.03, 379/392; 375/345
See application file for complete search history.

(56) References Cited

U.S. PATENT DOCUMENTS

| 5,473,666 | A | * | 12/1995 | Szczebak et al. | 379/3 |
| 6,212,273 | B1 | * | 4/2001 | Hemkumar et al. | 379/406.08 |
| 7,003,099 | B1 | * | 2/2006 | Zhang et al. | 379/406.03 |
| 2010/0151787 | A1 | * | 6/2010 | Contreras et al. | 455/41.2 |

FOREIGN PATENT DOCUMENTS

WO WO-2008122930 10/2008

OTHER PUBLICATIONS

"International Search Report and Written Opinion", Application No. PCT/EP2012/059400, (Mar. 5, 2013), 17 pages.
"Partial International Search Report", Application No. PCT/EP2012/059400, (Aug. 24, 2012), 7 pages.

* cited by examiner

*Primary Examiner* — April G Gonzales
(74) *Attorney, Agent, or Firm* — Sonia Cooper; Jim Ross; Micky Minhas

(57) ABSTRACT

A method of processing an audio signal transmitted from a remote transmitter and received at a local receiver of an acoustic system, includes at the receiver receiving with the audio signal an indication of remote transmitter gain, determining an overall system gain of the acoustic system from the remote transmitter gain and a local receiver gain and selectively applying a system gain reduction step to the audio signal if it is determined that the overall system gain exceeds a threshold.

26 Claims, 4 Drawing Sheets

PROCESSING AUDIO SIGNALS

FIELD

The invention relates to processing audio signals, particularly but not exclusively in the case of a communication session between a near end device and a far end device.

BACKGROUND

Communication systems allow users to communicate with each other over a network. The network may be, for example, the Internet or public switched telephone network (PSTN). Audio signals can be transmitted between nodes of the network, to thereby allow users to transmit and receive audio data (such as speech data) to each other in a communication session over the communication system.

A user device may have audio input means such as a microphone that can be used to receive audio signals such as speech from a user. The user may enter into a communication session with another user, such as a private call (with just two users in the call) or a conference call (with more than two users in the call). The user's speech is received at the microphone, processed and is then transmitted over a network to the other users in the call.

As well as the audio signals from the user, the microphone may also receive other audio signals, such as background noise, which are unwanted and which may disturb the audio signals received from the user.

The user device may also have audio output means such as speakers for outputting audio signals to near end user that are received over the network from a far end user during a call. Such speakers can also be used to output audio signals from other applications which are executed at the user device, and which can be picked up by the microphone as unwanted audio signals which would disturb the speech signals from the near end user.

A difficulty that can arise in an acoustic system is "howling". Howling is an unwanted effect which arises from acoustic feedback in the system, and causes a loud, often high pitched, persistent unwanted sound. Howling can be suppressed after it has been detected as audible, e.g. using a notch filter to suppress the howling. Most acoustic systems have an echo canceller (AEC) which can reduce howling, but depending on the AEC design, the task can be very challenging. In other AECs the howling is cancelled as the echo it is.

SUMMARY

The inventors have realised that it would be advantageous to anticipate howling, rather than address it after it has already occurred.

According to one aspect of the present invention there is provided a method of processing an audio signal transmitted from a remote transmitter and received at a local receiver of an acoustic system, the method comprising, at the local receiver:
  receiving with the audio signal an indication of transmitter gain;
  determining an overall system gain of the acoustic system from the transmitter gain and a local receiver gain; and
  selectively applying a system gain reduction step to the audio signal if it is determined that the overall system gain exceeds a threshold.

The major advantage in passing along gain information and using it to calculate the overall system gain, is that it can be accurately known when howling is about to happen, but before it actually happens. It can thus be prevented from ever becoming a problem by applying various techniques that reduce the system gain when it approaches the threshold, e.g. the critical value 1.

Furthermore, when using only local side system gain contribution information it is not possible to take into account if the far end user is e.g. wearing a head-set and thereby preventing a high system gain contribution from the local side to lead to howling.

Thus, embodiments of the invention can also be seen as a way to avoid taking counter measures to reduce the risk of howling when no counter measures are required.

In the described embodiment, determining local gain (near end or far end) of the acoustic system is carried out for each of a plurality of frequencies in the received signal. This allows one or more frequencies which cause a higher system gain to be identified.

The local gain can be estimated or actually measured. For example, it could be estimated or measured based on the echo path. References to "local gain" herein encompass an estimated local gain and/or a measured local gain.

The local gain can be estimated by multiplying all gains that are applied in the system, including the gain in the echo path which can be either estimated or predetermined. The overall system gain can be calculated by multiplying the near end gain and far end gain.

The system gain reduction gain step can comprise:
  providing a noise attenuation factor for reducing noise in the signal for at least one frequency, the noise attenuation factor for the at least one frequency based on the system gain or local gain for that frequency; and
  applying the noise attenuation factor to a component of the signal at that frequency.

Although it is possible to obtain a reduction in howling by attenuating only one frequency which is likely to predispose the acoustic system to howling, it is particularly advantageous if a respective local gain or system gain of the acoustic system is calculated for each of a plurality of frequencies in the received signal, and a noise attenuation factor is provided for each of the plurality of frequencies. In that case, each noise attenuation factor can be applied to a respective component of the signal at that frequency. In this way, the system gain spectrum of the acoustic system can be taken into account.

The invention is particularly useful where the received audio signal is speech from a user. In that case, the speech is processed in time intervals, for example, frames, and the respective system gain or local gain and noise attenuation factors are provided for each of the plurality of frequencies in each frame.

The gain reduction step can be applied on the signal that is captured at near end side, a signal for playout that has been received from the far end in a communication network, or be applied partly on the far end signal and partly on a signal received at the near end (for example, by an audio input means at a user device).

The invention provides in another aspect, a transmitter in an acoustic system, the transmitter comprising:
  audio input means arranged to receive a signal;
  means for providing an indication of transmitter side gain associated with at least one frequency;
  a signal processing stage connected to receive the signal from the audio input and configured to output for transmission a processed audio signal and the indication of transmitter gain.

A further aspect of the invention provides a receiver in an acoustic system, the receiver comprising:

input means for receiving an audio signal conveyed from a remote transmitter with an indication of remote transmitter gain;

means for determining an overall system gain of the acoustic system from the remote transmitter gain and a local receiver gain; and means for selectively applying a system gain reduction step to the audio signal if it is determined that the overall system gain exceeds a threshold.

The invention also provides a user device comprising a transmitter and a receiver as hereinabove defined.

The invention further provides an acoustic system comprising a transmitter and a receiver as hereinabove defined, in communication with one another over a communication network.

It will readily be appreciated that references herein to near end denote a local user who can input a signal using audio input means and/or receive a signal from a far end transmitter. Similarly, references to far end denote a device located across a communication network in communication with a near end device via the network.

References herein to local gain denote a gain at either the near end or the far end. An overall system gain is a combination of the local gain at the near end and the local gain at the far end.

For a better understanding of the present invention and to show how the same may be carried into effect, reference will now be made by way of example to the accompanying drawings.

DESCRIPTION OF THE PREFERRED EMBODIMENTS

In the following described embodiments of the invention, a technique is described wherein local side (transmitter) gain information is sent along with an audio signal. By sending local side system gain information to the far end side (receiver) alongside the encoded audio signal accurate (full) system gain information can be calculated on the far end side by combining the received information with what can be calculated or estimated or measured locally. This information will estimate the risk of howling which happens if the system gain is higher than one. In a preferred embodiment of the invention, the system gain is estimated in frequency bands, and used to reduce the system gain in each band only as much as necessary to prevent howling from building up. Before describing the particular embodiments of the present invention, a context in which the invention can usefully be applied will now be described with reference to FIG. 1, which illustrates a communication system 100.

A first user of the communication system (User A 102) operates a user device 104. The user device 104 may be, for example a mobile phone, a television, a personal digital assistant ("PDA"), a personal computer ("PC") (including, for example, Windows™, Mac OS™ and Linux™ PCs), a gaming device or other embedded device able to communicate over the communication system 100.

The user device 104 comprises a central processing unit (CPU) 108 which may be configured to execute an application such as a communication client for communicating over the communication system 100. The application allows the user device 104 to engage in calls and other communication sessions (e.g. instant messaging communication sessions) over the communication system 100. The user device 104 can communicate over the communication system 100 via a network 106, which may be, for example, the Internet or the Public Switched Telephone Network (PSTN). The user device 104 can transmit data to, and receive data from, the network 106 over the link 110.

Figure 1:
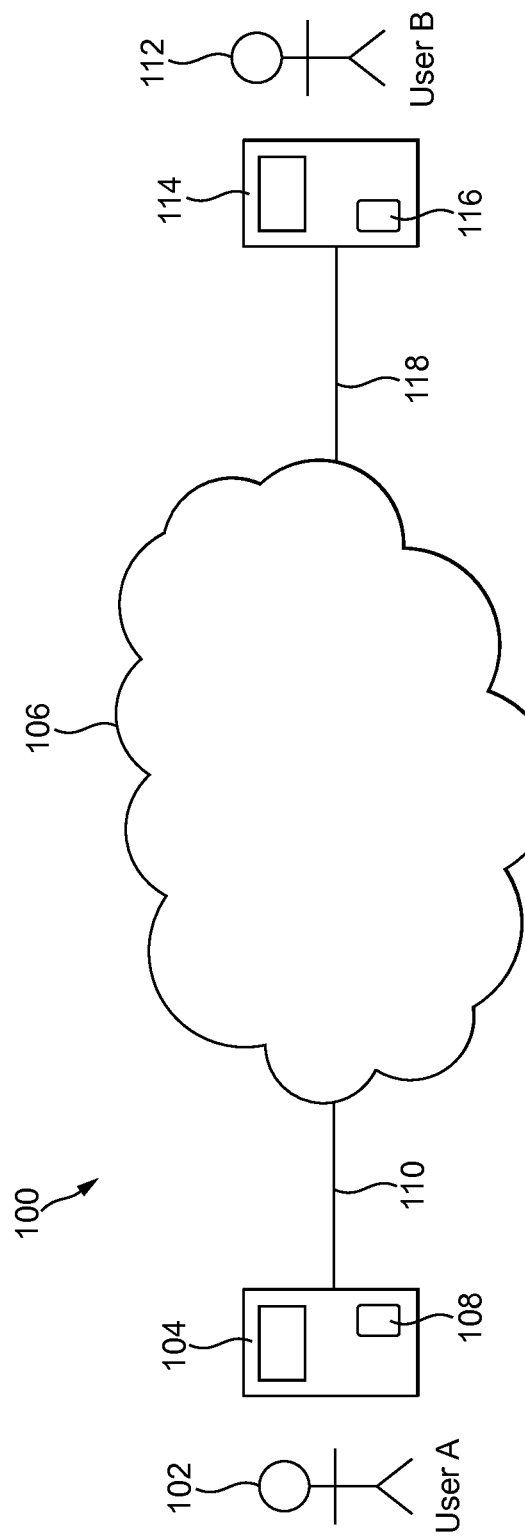
FIG. 1 is a schematic diagram of a communication system.

FIG. 1 also shows a remote node with which the user device 104 can communicate over the communication system 100. In the example shown in FIG. 1, the remote node is a second user device 114 which is usable by a second user 112 and which comprises a CPU 116 which can execute an application (e.g. a communication client) in order to communicate over the communication network 106 in the same way that the user device 104 communicates over the communications network 106 in the communication system 100. The user device 114 may be, for example a mobile phone, a television, a personal digital assistant ("PDA"), a personal computer ("PC") (including, for example, Windows™, Mac OS™ and Linux™ PCs), a gaming device or other embedded device able to communicate over the communication system 100. The user device 114 can transmit data to, and receive data from, the network 106 over the link 118. Therefore User A 102 and User B 112 can communicate with each other over the communications network 106.

Figure 2:
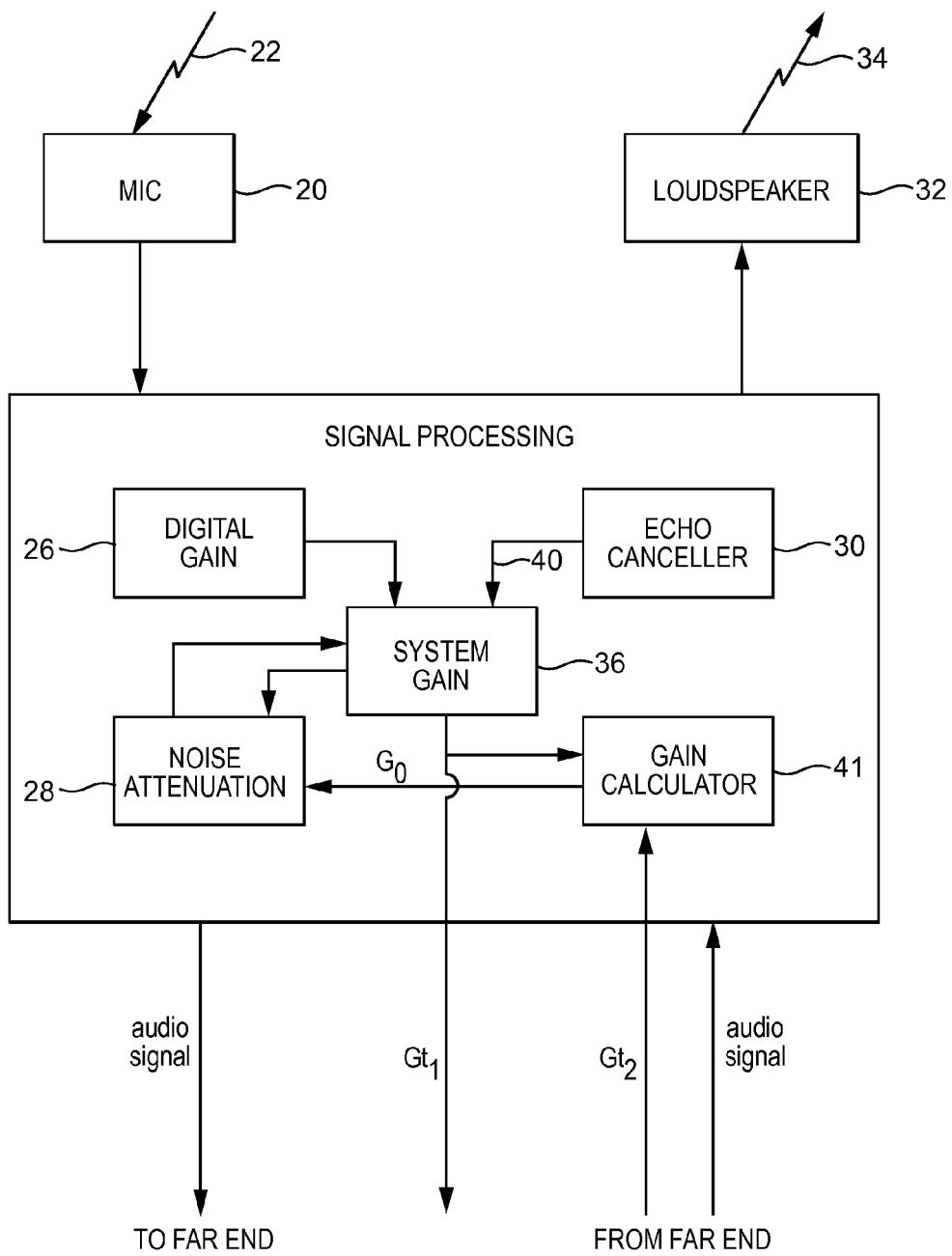
FIG. 2 is a block diagram of a user device.

FIG. 2 illustrates the user device 104 at the near end speaker in more detail. In particular, FIG. 2 illustrates a microphone 20 receiving a speech signal from user 22. The microphone can be a single microphone or a microphone array comprising a plurality of microphones and optionally including a beamformer. As is known, a beamformer receives audio signals from the microphones in a microphone array and processes them in an attempt to improve the signal in a wanted direction in comparison to signals perceived to be coming from unwanted directions. This involves applying a higher gain in a desired direction.

In addition, there might be other sources of unwanted noise in a room, such as cooling fans, air conditioning systems, music playing in the background and keyboard taps. All such noises can contribute to disturbance to the audio signal received at the microphone from the near end user for transmission in the call to a far end user.

In order to improve the quality of the signal, such as for use in the call, it is desirable to suppress unwanted audio signals (the background noise and the unwanted audio signals output from the user device) that are received at the audio input means of the user device. Various noise reduction techniques are known for this purpose including, for example, spectral subtraction (for example, as described in the paper "Suppression of acoustic noise in speech using spectral subtraction" by S. F. Bool IEEE Trans. Acoustics, Speech, Signal Processing (1979), 27(2): pages 113-120.

Signals from the microphone (whether with or without a beamformer) are applied to a signal processing stage 24. The signal processing stage 24 includes a plurality of signal processing blocks, each of which can be implemented in hardware or software or a combination thereof as is deemed appropriate. The blocks can include, for example, a digital gain block 26, (AGC—automatic gain control) a noise attenuation block 28 and an echo canceller block 30.

A loud speaker 32 is provided to provide audio signals 34 intended for the user 102. Such signals can come from a far end speaker to be output to a user, or can alternatively come from the user device itself as discussed earlier. In a situation where signals output by the loudspeaker 34 come from a far end user such as user 112, they can be processed before being emitted by the loudspeaker by signal processing circuitry and for the sake of convenience the loudspeaker is shown connected to signal processing circuitry 24 in FIG. 2. Optionally, they can be processed using the noise attenuation technique described below.

After signal processing, the signals input by the user 102 and picked up by the microphone 20 are transmitted for communicating with the far end user 112.

The signal processing circuitry 24 further includes a local system gain estimation block 36. As discussed in more detail later, and as described in our earlier patent application No. GB 1102704.2, block 36 estimates local system gain taking into account the shape of the gain spectrum. That is, the system gain varies with frequency. Estimates of local system gain for different frequencies are supplied to the noise attenuation block 28, and are transmitted to the far end as transmitter gain information $G_{t1}$. Similarly, an audio signal received from the far end into the signal processing stage comes with far end transmitter gain information $G_{t2}$.

Howling is a symptom of having feedback with a system gain higher than 1 somewhere in the frequency spectrum. By reducing the system gain at this frequency, the howling will stop. Very often, a resonating frequency in the loudspeaker, microphone or echo path will be much larger than average and will be what is limiting the robustness to howling. The system gain is estimated by taking into consideration the blocks involved in system processing (including for example the digital gain block, echo canceller, and background noise attenuation block), and in particular, uses information from the echo path estimated in the echo canceller attenuation block which provides information about the room in which the device is located. The shape of the spectrum is usually dominated by the estimated echo path, as the transfer function of the echo path includes the transfer function of the loudspeaker where resonating frequencies often occur. In FIG. 2, the estimated echo path is denoted by arrow 40.

By estimating local system gain spectrum contribution from the near end side, it is possible to obtain knowledge about which parts of the spectrum are more likely to dominate in generation of a howling effect. When two similar devices 104, 114 are being used in a call, this half-side information can be very accurate in terms of knowing which part of the spectrum will be dominating as the resonating frequencies will coincide on the two devices. Additionally, in FIG. 2, side information $G_{t2}$ regarding the system gain from the far end is received along with an audio signal.

On the receiving side, the received information is combined with local side information to gain knowledge about the combined (overall) system gain $G_O$ for far end and near end. This is carried out in a system gain calculation block 41. The gain information $G_t$ is provided with frequency information, each gain value associated with a respective frequency. In one embodiment, a single gain value associated with a single frequency or frequency band is transmitted. A frequency causing a higher system gain can be identified based on known characteristics of a device. For example, it might be apparent that a particular component of the device (for example, a loudspeaker) has a problematic resonant frequency which would cause howling.

This system gain information can be used to predict when howling is about to happen, e.g. as a result of increasing gain in the AGC on either side, and counter measures can be taken immediately, to prevent that howling will ever build up.

The estimate of overall system gain $G_O$ is used to selectively reduce howling. If it is determined that the overall system gain is less than 1, no action is taken and any steps that were being taken, as discussed below, are disabled. If however, it is determined that the overall system gain is greater than 1, gain reduction steps are effected in the signal processing, as discussed in one embodiment below. In the preferred embodiment, noise reduction is increased in the most critical bands, and as the last resort, the digital gain (block 26) applied to far end and near ends is slightly reduced. The estimate of system gain spectrum supplied to the noise attenuation block 28 is used to modify operation of the noise attenuation method, as discussed below.

The estimate is preferably of the overall system gain as determined by the gain calculation block 41. However, it is possible to use the local gain from local system gain block 36.

Signal processing is performed on a per frame basis. Frames can, for example, be between 5 and 20 milliseconds in length and for the purpose of noise suppression be divided into spectral bins, for example, between 64 and 256 bins per frame. Each bin contains information about a signal component at a certain frequency, or in a certain frequency band. For dealing with wideband signals, the frequency range from 0 to 8 kHz is processed, divided into 64 or 32 frequency bands of equal width. It is not necessary that the bands are of equal width—they could for example be adjusted to better reflect the critical bands of the human hearing such as done by the Bark scale.

Ideally, for speech, each frame is processed in real time and each frame receives an updated estimate of system gain for each frequency bin from system gain block 36. Thus each bin is processed using an estimate of system gain specific to that frame and the frequency of that bin.

Figure 3:
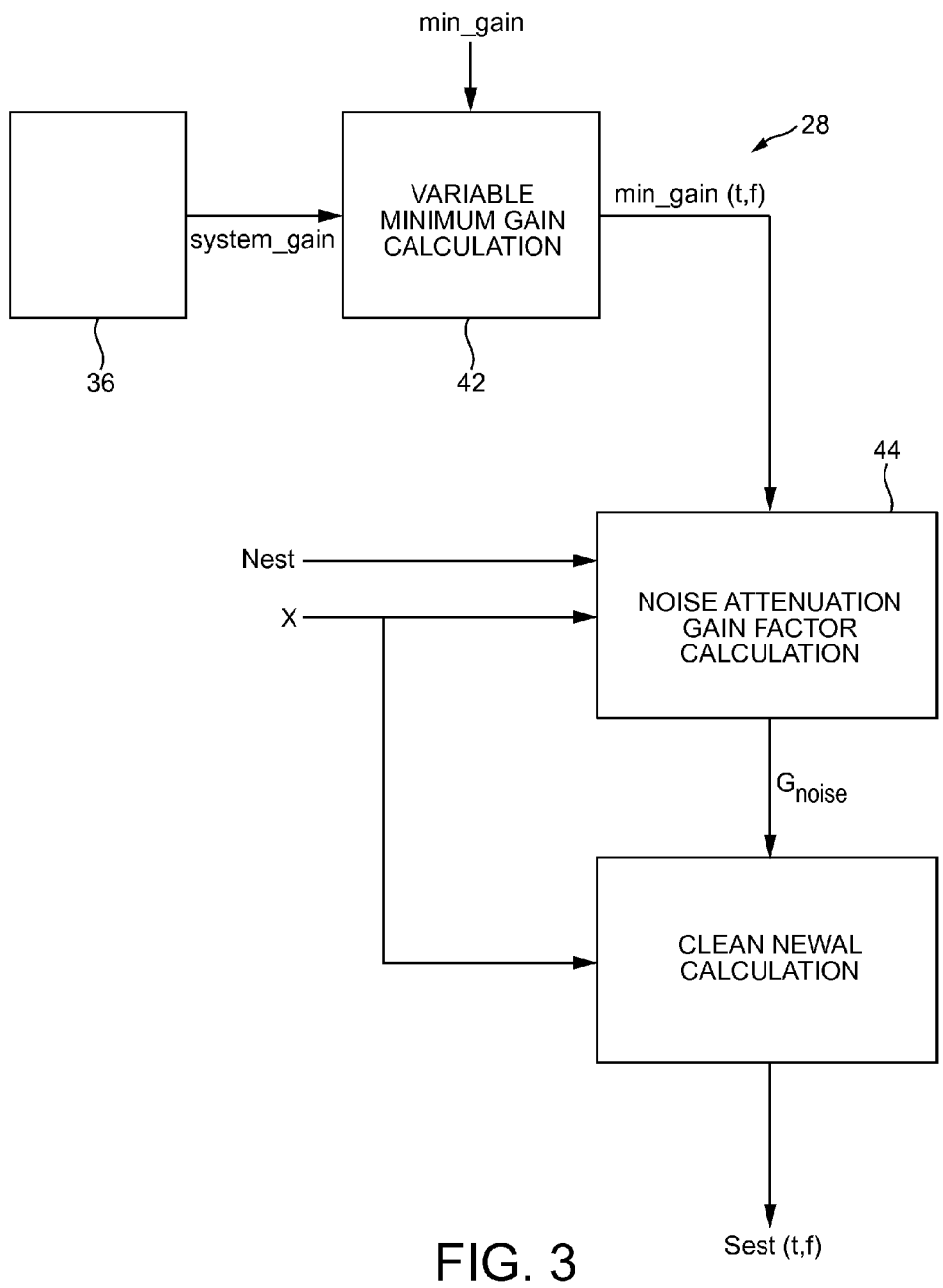
FIG. 3 is a schematic function diagram of a noise attenuation technique.

FIG. 3 illustrates according to one example of a system gain reduction step, how a noise attenuation gain factor can be calculated to take into account frequency based estimates of system gain.

In the following example, there is achieved the advantage of system gain reduction arising from equalisation by noise attenuation, while adapting to the actual conditions. This means that any acoustic effect on the system gain spectrum from the room is taken into account.

It will be appreciated that FIG. 3 illustrates various functional blocks which can be implemented in software as appropriate. A variable minimal gain calculation block 42 generates a variable minimum gain value min_gain(t,f) at time t and frequency f. The variable minimum gain value is generated based on the system gain (or local gain) system_gain and a fixed minimum gain value min_gain as in equation 1.

$$\text{min\_gain}(t,f) = \text{min\_gain} * f(\text{system\_gain}(t,f)) \quad\quad 1.$$

In the variable minimum calculation block the function, $f(\cdot)$, of the system gain according to one example is as given in equation 2, where avg_system_gain(t) denotes the average system gain at time t.

$$f(\text{system\_gain}(t,f)) = \min(\max(\text{system\_gain}(t,f)/\text{avg\_system\_gain}(t), 1.25, 5.25) - 0.25)^{-1}. \quad 2.$$

This function has the effect of lowering the variable minimum gain value min_gain(t,f) when the system gain is high in the current frequency band. As will be clear from the following, this has the effect of more noise attenuation in the bands with the highest local system gain.

The variable minimum gain value is supplied to a noise attenuation gain factor calculation block 44. This block calculates a noise attenuation gain factor $G_{noise}(t,f)$ at time t and frequency f. The gain factor $G_{noise}$ takes into account a noise level estimate $N_{est}$ and the signal received from the microphone X, representing the signal plus noise incoming from the microphone.

A first noise attenuation gain factor is calculated according to equation 3.

$$G_{noise}(t,f)=((X(t,f)^2-N_{est}(t,f)^2)/X(t,f)^2)=(1-(X(t,f)^2/N_{est}(t,f)^2)^{-1}). \qquad 3.$$

In classical noise reduction, such as for example, power spectral subtraction as in the example above, the coefficient $S_{est}(t,f)$ at time t and frequency f of the estimated clean signal is calculated as the square root of the noise attenuation gain multiplied with the squared coefficients of the signal plus noise—that is, as in equation 4 where equation 3 provides the noise attenuation gain factor $G_{noise}$.

$$S_{est}(t,f)=sqrt(G_{noise}(t,f)*X(t,f)^2) \qquad 4.$$

Thus, $S_{est}(t,f)$ represents the coefficient of the best estimate of a clean signal for transmission to the far end after signal processing.

The noise attenuation gain factor $G_{noise}$ can be lower limited for improving perceptual quality as in equation 5.

$$G_{noise}(t,f)=\max(1-(X(t,f)^2/N_{est}(t,f)^2)^{-1},\min\_gain(t,f)). \qquad 5.$$

That is, the noise attenuation gain factor calculated according to equation 3, is only applied to the extent that it is above a minimum gain value min_gain (f,t).

In existing noise reduction techniques, the minimum gain value is fixed at min_gain, and could take, for example, a constant value of approximately 0.2. In contrast, embodiments of the present invention vary the minimum gain value as has been described to provide an individual minimum gain for each frequency band, such that the minimum gain value can be lowered when the local system gain for that band is high. The minimum gain value is a function of the system gain spectrum which is adapted over time, such that it tracks any changes that may occur in the system gain spectrum.

By incorporating spectral system gain equalisation in the noise reduction method, it is provided that in a state of no speech activity, the left-behind noise is equalised by applying more noise reduction in frequency bands where the system gain is high and thereby reducing the system gain in those bands. This is shown in equation 5, which indicates that the noise attenuation gain factor $G_{noise}$ is the maximum of the variable minimum gain value and the value calculated using the signal-plus-noise to noise ratio. This has the effect of allowing more noise reduction (lower $G_{noise}$) when the signal-plus-noise to noise ratio is low. When the signal-plus-noise to noise ratio is high, however, for example in the case of near end activity, the effect of the variable minimum gain factor is overtaken by the conventional calculation of the noise attenuation factor $G_{noise}$, which reduces the noise attenuation as the signal to noise ratio increases. In such a case, near end speech is thus left without any significant reduction or equalisation.

Figure 4:
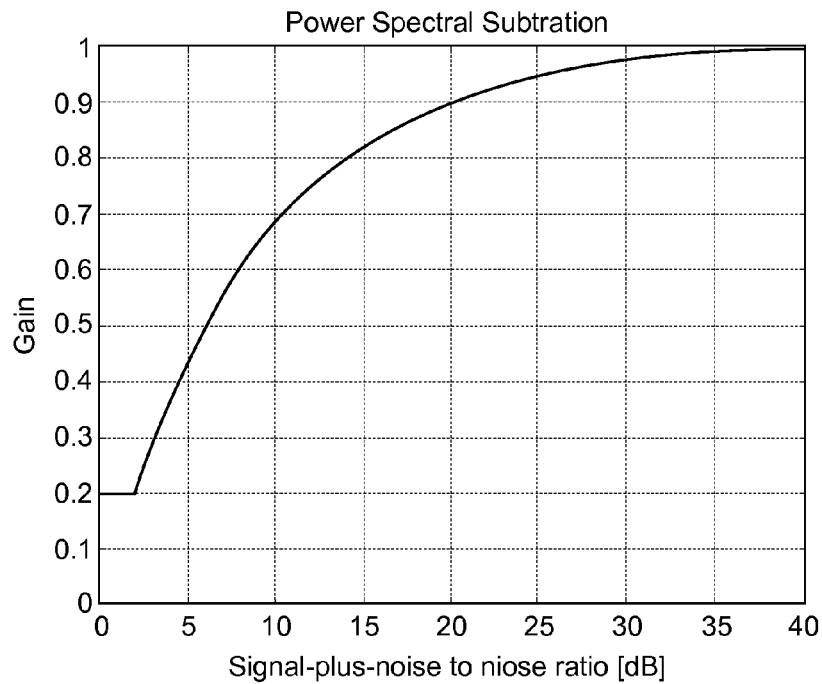
FIG. 4 is a graph of gain vs. signal plus noise to noise ratio.

FIG. 4 illustrates the case where the minimum gain is a constant value of approximately 0.2 and shows the effect on the gain factor $G_{noise}$ as the signal plus noise to noise ratio increases. As $G_{noise}$ approaches 1, the noise attenuation decreases until it is virtually zero as the signal plus noise to noise ratio increases.

Figure 5:
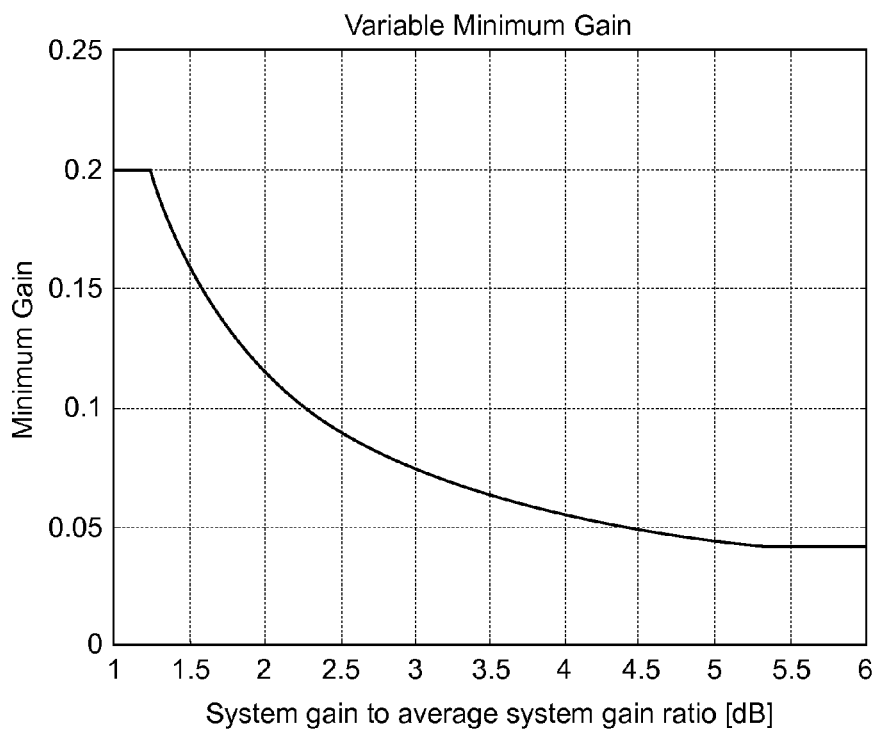
FIG. 5 is a graph of minimum gain vs. system gain to average system gain ratio.

FIG. 5 is a graph showing how the minimum gain varies as a function of the system gain according to equation 2.

Another example of a system gain reduction step is adjusting the digital gain applied to the signal by block 26.

Where it is determined that no howling is anticipated based on the determination of overall system gain, no gain reduction steps are implemented, and any that were being implemented are disabled pending a new assignment of overall gain.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

The invention claimed is:

1. A method of processing an audio signal transmitted from a remote transmitter and received at a local receiver of an acoustic system, the method comprising, at the local receiver:
   receiving with the audio signal an indication of remote transmitter gain;
   determining a system gain of the acoustic system from the remote transmitter gain and a local receiver gain;
   selectively applying a system gain reduction to the audio signal if it is determined that the system gain exceeds a threshold, the system gain reduction comprising:
      providing a noise attenuation factor for reducing noise in the audio signal for at least one frequency, the noise attenuation factor for the at least one frequency based on the local receiver gain for the at least one frequency; and
      applying the noise attenuation factor to a component of the audio signal at the at least one frequency.

2. A method according to claim 1, comprising estimating the system gain or the local receiver gain for each of a plurality of frequencies in the received audio signal, wherein a respective noise attenuation factor is provided for each of the plurality of frequencies, and each noise attenuation factor is applied to a respective component of the audio signal at each of the plurality of frequencies.

3. A method according to claim 1, wherein the system gain reduction comprises altering a digital gain applied to the audio signal.

4. A method according to claim 1, wherein the selectively applying the system gain reduction comprises disabling the system gain reduction if the system gain is determined not to exceed the threshold.

5. A method according to claim 1, wherein the remote transmitter gain is estimated from an echo path in the transmitter.

6. A method according to claim 1, wherein the local receiver gain is estimated from an echo path in the receiver.

7. A method according to claim 1, wherein the remote transmitter gain is estimated from the gain in each of a plurality of processing blocks in a signal processing stage of the transmitter.

8. A method according to claim 1, wherein the system gain is estimated from each of a plurality of processing blocks in a signal processing stage of the receiver.

9. A method according to claim 1, wherein at least one of the remote transmitter gain or the local receiver gain are measured.

10. A method according to claim 1, wherein the audio signal is conveyed from the transmitter to the receiver over a communication network.

11. A transmitter in an acoustic system, the transmitter comprising:
   an audio input arranged to receive an audio signal;

an indication generator for providing an indication of transmitter side gain associated with at least one frequency;

a signal processing stage connected to receive the audio signal from the audio input and configured to output for transmission a processed audio signal and the indication of transmitter side gain, the transmission effective to enable a receiver to:

receive the processed audio signal and the indication of transmitter side gain from the transmitter;

determine a system gain of the acoustic system from the indication of transmitter side gain and a local receiver gain; and selectively apply a system gain reduction to the processed audio signal by altering a digital gain applied to the audio signal, if it is determined that the system gain exceeds a threshold.

12. A transmitter according to claim 11, further comprising a component for estimating the transmitter side gain for the at least one frequency in the audio signal.

13. A receiver in an acoustic system, the receiver comprising:

an input for receiving an audio signal conveyed from a remote transmitter with an indication of remote transmitter gain;

a component for determining an system gain of the acoustic system from the remote transmitter gain and a local receiver gain; and a system gain application component for selectively applying a system gain reduction to the audio signal if it is determined that the system gain exceeds a threshold, the system gain application component comprising:

a component for providing a noise attenuation factor for reducing noise in the audio signal for at least one frequency, the noise attenuation factor for the least one frequency based on the local receiver gain or the system gain for that frequency; and a component for applying the noise attenuation factor to a component of the audio signal of the at least one frequency.

14. A receiver according to claim 13, further comprising a component for estimating the receiver side gain.

15. A receiver according to claim 13, further comprising a component for measuring the receiver side gain.

16. A receiver according to claim 13, wherein the system gain application component applies the system gain reduction by adjusting a digital gain applied to the audio signal.

17. A receiver according to claim 13, wherein the system gain application component applies the system gain reduction by adjusting an analogue gain applied to the audio signal.

18. A user device for use in an acoustic system, the user device including:

a transmitter, the transmitter comprising:
an audio input arranged to receive a signal;
an indication generator for providing an indication of transmitter gain associated with at least one frequency;
a signal processing stage connected to receive the signal from the audio input and configured to output a processed audio signal and the indication of transmitter gain for transmission;

a receiver, the receiver comprising:
a remote side input for receiving an audio signal conveyed from a remote transmitter with an indication of remote transmitter gain;

a component for determining a system gain of the acoustic system from the remote transmitter gain and a local receiver gain; and a gain reduction component for selectively applying a system gain reduction to the audio signal received at the remote side input if it is determined that the system gain exceeds a threshold.

19. A user device according to claim 18, wherein the audio input comprises a microphone.

20. A user device according to claim 18, comprising a loudspeaker for providing audio signals to a user.

21. An acoustic system comprising:
a remote transmitter comprising:
an audio input arranged to receive a signal;
an indication generator providing an indication of transmitter gain associated with at least one frequency; and
a signal processing stage connected to receive the signal from the audio input and configured to output an audio signal and the indication of transmitter gain for transmission; and a local receiver comprising:
a remote side input for receiving the audio signal and the indication of transmitter gain conveyed from the remote transmitter;
a component for determining a system gain of the acoustic system from the indication of transmitter gain and a local receiver gain; and
a system gain application component for selectively applying a system gain reduction to the audio signal if it is determined that the system gain exceeds a threshold; and a communication network for conveying the audio signal and the indication of transmitter gain from the remote transmitter to the local receiver.

22. A method of processing an audio signal transmitted from a remote transmitter and received at a local receiver of an acoustic system, the method comprising, at the receiver:

receiving with the audio signal an indication of a remote transmitter gain;

determining a system gain of the acoustic system from the remote transmitter gain and a local receiver gain; and selectively applying a system gain reduction to the audio signal by altering a digital gain applied to the audio signal, if it is determined that the system gain exceeds a threshold.

23. A method of processing an audio signal transmitted from a remote transmitter and received at a local receiver of an acoustic system, the method comprising, at the receiver:

receiving with the audio signal an indication of a remote transmitter gain, the remote transmitter gain being estimated from the gain in each of a plurality of processing blocks in a signal processing stage of the transmitter;

determining a system gain of the acoustic system from the remote transmitter gain and a local receiver gain; and selectively applying a system gain reduction to the audio signal if it is determined that the system gain exceeds a threshold.

24. A method of processing an audio signal transmitted from a remote transmitter and received at a local receiver of an acoustic system, the method comprising, at the receiver:

receiving with the audio signal an indication of a remote transmitter gain;

determining a system gain of the acoustic system from the remote transmitter gain and a local receiver gain, the system gain being estimated from each of a plurality of processing blocks in a signal processing stage of the receiver; and selectively applying a system gain reduction to the audio signal if it is determined that the system gain exceeds a threshold.

25. A receiver in an acoustic system, the receiver comprising:
- an input for receiving an audio signal conveyed from a remote transmitter with an indication of a remote transmitter gain;
- a component for determining a system gain of the acoustic system from the remote transmitter gain and a local receiver gain; and
- a system gain application component for selectively applying a system gain reduction to the audio signal by adjusting the digital gain applied to the audio signal, if it is determined that the system gain exceeds a threshold.

26. A receiver in an acoustic system, the receiver comprising:
- an input for receiving an audio signal conveyed from a remote transmitter with an indication of a remote transmitter gain;
- a component for determining a system gain of the acoustic system from the remote transmitter gain and a local receiver gain; and
- a system gain application component for selectively applying a system gain reduction to the audio signal by adjusting the analogue gain applied to the audio signal, if it is determined that the system gain exceeds a threshold.

* * * * *